US010856403B2

(12) United States Patent
Manninen et al.

(10) Patent No.: US 10,856,403 B2
(45) Date of Patent: Dec. 1, 2020

(54) POWER ELECTRONICS MODULE AND A METHOD OF PRODUCING A POWER ELECTRONICS MODULE

(71) Applicant: ABB Schweiz AG, Baden (CH)

(72) Inventors: Jorma Manninen, Vantaa (FI); Mika Silvennoinen, Espoo (FI); Joni Pakarinen, Vantaa (FI); Kjell Ingman, Sipoo (FI)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/262,991

(22) Filed: Jan. 31, 2019

(65) Prior Publication Data

US 2019/0239337 A1    Aug. 1, 2019

(30) Foreign Application Priority Data

Jan. 31, 2018 (EP) .................................... 18154356

(51) Int. Cl.

| *H05K 7/20* | (2006.01) |
| *H01L 21/58* | (2006.01) |
| *H01L 23/00* | (2006.01) |
| *H01L 23/31* | (2006.01) |
| *H01L 23/34* | (2006.01) |
| *H01L 23/48* | (2006.01) |
| *H01L 23/367* | (2006.01) |
| *H01L 23/373* | (2006.01) |
| *H01L 33/64* | (2010.01) |
| *H05K 1/02* | (2006.01) |

(Continued)

(52) U.S. Cl.

CPC ......... *H05K 1/0203* (2013.01); *H01L 23/373* (2013.01); *H01L 23/3735* (2013.01); *H01L 23/42* (2013.01); *H01L 23/433* (2013.01); *H05K 3/0061* (2013.01); *H05K 3/341* (2013.01)

(58) Field of Classification Search
CPC ........... H05K 7/20; H01L 21/58; H01L 23/00; H01L 23/31; H01L 23/34; H01L 23/48; H01L 23/367; H01L 23/373; H01L 33/64
USPC ........ 361/707, 699, 704, 708; 428/220, 323, 428/614; 438/121; 257/99, 108, 614
See application file for complete search history.

(56) References Cited

U.S. PATENT DOCUMENTS

| 5,977,568 A | * | 11/1999 | Klaka | ............... H01L 24/72 257/108 |
| 6,045,927 A | * | 4/2000 | Nakanishi | ......... H01L 23/3735 257/712 |

(Continued)

FOREIGN PATENT DOCUMENTS

EP    3163611 A1    5/2017

OTHER PUBLICATIONS

European Patent Office, Search Report issued in corresponding Application No. 18154356.2, dated Jul. 23, 2018, 1 pp.

*Primary Examiner* — Xiaoliang Chen
(74) *Attorney, Agent, or Firm* — Taft Stettinius & Hollister LLP; J. Bruce Schelkopf

(57) ABSTRACT

A power electronics module and a method of producing a power electronics module. The power electronics module includes multiple of power electronic semiconductor chips incorporated in a housing and attached to a substrate, and a heat transfer structure attached to the substrate and having a bottom surface which forms an outer surface of the module and which is adapted to receive a surface of a cooling device, wherein the heat transfer structure includes a compressible base plate.

16 Claims, 3 Drawing Sheets

(51) Int. Cl.
  *H05K 3/34*      (2006.01)
  *H05K 3/00*      (2006.01)
  *H01L 23/42*     (2006.01)
  *H01L 23/433*    (2006.01)

(56) References Cited

U.S. PATENT DOCUMENTS

| | | | |
|---|---|---|---|
| 10,043,729 B1* | 8/2018 | Manninen | H01L 23/373 |
| 2005/0133698 A1* | 6/2005 | Oniki | G02B 7/008 |
| | | | 250/216 |
| 2007/0041160 A1* | 2/2007 | Kehret | H05K 7/20254 |
| | | | 361/704 |
| 2008/0218970 A1* | 9/2008 | Kehret | H05K 7/1434 |
| | | | 361/699 |
| 2009/0122491 A1 | 5/2009 | Martin et al. | |
| 2011/0053319 A1* | 3/2011 | Hohlfeld | H01L 23/24 |
| | | | 438/121 |
| 2011/0261535 A1* | 10/2011 | Izutani | H01L 23/36 |
| | | | 361/708 |
| 2011/0262728 A1* | 10/2011 | Izutani | C08L 23/06 |
| | | | 428/220 |
| 2011/0267557 A1* | 11/2011 | Izutani | G02F 1/1336 |
| | | | 349/61 |
| 2012/0049233 A1* | 3/2012 | Yuan | H01L 25/167 |
| | | | 257/99 |
| 2013/0065987 A1* | 3/2013 | Fukuzaki | C09J 7/10 |
| | | | 523/445 |
| 2013/0200298 A1* | 8/2013 | Izutani | C09K 5/14 |
| | | | 252/74 |
| 2013/0327370 A1* | 12/2013 | Ward | H01L 35/32 |
| | | | 136/230 |
| 2016/0316589 A1* | 10/2016 | Silvennoinen | H01L 23/367 |
| 2016/0345462 A1* | 11/2016 | Manninen | H01L 23/3735 |
| 2017/0018481 A1* | 1/2017 | Zeng | H01L 23/3737 |
| 2017/0117208 A1* | 4/2017 | Kasztelan | H01L 23/49562 |
| 2017/0125321 A1* | 5/2017 | Manninen | H01L 21/4882 |
| 2017/0271229 A1* | 9/2017 | Santos | H01L 21/0206 |
| 2018/0026296 A1* | 1/2018 | Kruger | H01M 10/647 |
| 2018/0030327 A1* | 2/2018 | Zhang | C08K 3/22 |
| 2018/0030328 A1* | 2/2018 | Zhang | C09K 5/14 |
| 2019/0103378 A1* | 4/2019 | Escher-Poeppel | H01L 24/83 |
| 2019/0116670 A1* | 4/2019 | Anderson | H01L 23/00 |
| 2019/0122954 A1* | 4/2019 | Bruzda | H01L 23/42 |

* cited by examiner

US 10,856,403 B2

POWER ELECTRONICS MODULE AND A METHOD OF PRODUCING A POWER ELECTRONICS MODULE

FIELD OF THE INVENTION

The invention relates to power electronics modules, and particularly to a power electronics module with improved cooling properties.

BACKGROUND OF THE INVENTION

Power electronics modules are commonly used in high powered devices for switching high currents and operating on high voltages. Power electronics modules contain multiple of switch components which are situated in a same component housing and typically internally connected to each other to provide a certain circuit structure.

Power electronics modules are used, for example, for producing certain power conversion circuits, such as inverters and converters. An example of a power electronics module contains two IGBTs (Insulated Gate Bi-polar Transistors) which are connected in series inside the module. Other examples may include bridge topologies or parts of bridge topologies which are readily electrically connected inside the module.

Power electronics modules may also comprise a base plate which is typically made of copper. The purpose of the base plate is to conduct the heat generated by the semiconductors to a cooling device, such as heatsink. The surface of the base plate is typically a substantially planar surface to which a heatsink can be attached. The heatsink is further dimensioned to take into account the amount of heat generated by the semiconductor components in the module.

FIG. 1 shows an example of a cross-section of a power electronics module 1 attached to a heatsink 2. The power electronics module of the example comprises two semiconductor chips 11, 12 which are soldered to a substrate such as direct copper bonding (DCB) structure. The DCB structure of the example has two copper plates 3 and a ceramic layer 4 between the copper plates 3. The DCB structure is soldered with a solder layer 5 on the top of a copper base plate 7 of the module. The module further comprises a housing 6 which is shown with a dash-dot line surrounding the DCB structure and the chips.

The module of the example of FIG. 1 is attached to an external heatsink such that a thermal interface material 8 layer is placed between the base plate of the module and the base plate of the heatsink. The purpose of the thermal interface material is to transfer the heat from the module's base plate to the heatsink as effectively as possible. It should be noted that FIG. 1 is provided only to show an example of structure of power electronic module attached to a heatsink. It is clear that other kinds of structures exist.

Power electronics modules can also be formed without a base plate. In such module, the copper plate of the DCB structure forms the outer surface of the module. For cooling the module, a heatsink or any other cooling device, is attached to the copper plate of the DCB structure.

Power electronic modules' heat loss is dissipated mainly via its base plate that has to be in good thermal connection with a proper cooling device. The latter is clear dimensioning task but managing good and reliable thermal connection between the module and its cooler is more challenging. Thermal connection between two surfaces depends on several properties including their surface roughness (Ra) and surfaces' planarity. In practice the contact of two surfaces is imperfect and there are gaps filled with air in between them. Because air is poor thermal conductor the contact thermal resistance can be reduced by: making the contact surfaces perfectly smooth and planar and/or by replacing the air by a better thermal conducting substance.

Specific materials have been developed to fill air gaps between the surfaces in contact and to reduce contact thermal resistance. These so called thermal interface materials are available in different physical forms like dispensable grease or paste, various thickness rubber like pads, metal foils and so on. These materials are typically mixtures that include carrier or substrate chemical (like silicone oil or rubber) that has been filled with higher thermal conducting material like boron nitride or carbon nanotubes. Typical thermal conductivity of conventional TIMs is relatively low, say 0.7 W/mK . . . 5 W/mK, that is often feasible for typical application as the thermal interface materials bond line thickness is only 25 μm to 100 μm. The higher the thermal interface materials thermal conductivity and the thinner it is, the lower thermal resistance between power module and the cooling device is obtained. This further results in lower chip temperature level. Some thermal interface materials have also phase changing property, which may be beneficial for example in cyclic operation applications. This type of thermal interface materials are proven to work well in many applications where the contact surface area is relatively small and planar like in CPUs. Lately also graphite/graphene based thermal interface material foils have emerged to the markets and their physical properties differ significantly from conventional TIMs. Graphite sheets act like very soft solid material but they have highly anisotropic thermal conductivity, e.g. in-plane k~1000 W/mK and through-thickness k~6 W/mK.

Power electronics module's internal electronics packing density increases gradually with advanced construction materials and manufacturing methods. This is leading to more challenging module external cooling solutions as devices are able to create very high, over 35 W/cm², hot spots to the heatsink surface.

In view of cooling the situation is most demanding when the module is operated at its maximum current and voltage level i.e. at maximum power. In this condition the conventional aluminium heat sinks' baseplate spreading thermal resistance is too high for the module base plate high heat spots. That is, a conventional aluminium heatsink is not able to spread the heat transferred from the baseplate of the module fast enough. This results in both higher heatsink-to-baseplate temperatures and chip-to-junction temperatures accordingly. Although novel components may allow higher junction temperatures than before due to novel chip material, the component may not be fully utilized unless the power electronics module's external cooling is not at appropriate level.

For the cooling devices to be operational, the power electronics module and the cooling device should be in a thermal contact in which heat is transferred from the power electronics module to the cooling device as efficiently and reliably as possible. That is, the thermal resistance between the module and the heat sink or corresponding cooling device should be as low as possible and should not change during the operation. The use of a thermal interface material layer between the module and the cooling device requires care and attention during the installation of the device as the thermal interface material layers are thin and cumbersome to handle. Further, when heat pastes are used, the amount of paste used should be determined carefully as too thick layer increases the thermal resistance. A further problem with the conventional thermal interface material layers is that the foil-like layers may break and the grease or paste like materials may pump out when the power electronics module twists and bends during use.

BRIEF DESCRIPTION OF THE INVENTION

An object of the present invention is to provide a power electronics module and a method of producing a power electronics module so as to alleviate the above disadvantages. The objects of the invention are achieved by a method and a device which are characterized by what is stated in the independent claims. The preferred embodiments of the invention are disclosed in the dependent claims.

The invention is based on the idea forming the base plate of a power electronics module from a soft material such that the base plate is compressible. When attached to a cooling device, the base plate deforms and produces a reliable heat transfer structure from the substrate to the cooling device. When the base plate deforms, it fills all possible gaps that are in the surface of the cooling device and thereby provides low thermal resistivity and enhances the heat transfer. Further, as the base plate is compressible, the substrate "floats" inside the power electronics module on top of the base plate. Possible mechanical forces acting on the module are dampened and do not reach the substrate as easily as in known modules.

As the base plate of the power electronics module of the invention is soft and compressible, separate thermal interface material layers between the base plate and the cooling element can be avoided. The avoidance of separate material layers which are to be applied during installation of the module help in decreasing the thermal resistivity between the heat sources, i.e. semiconductor chips, and the cooling element. This further means that the heat transfer capacity is increased.

The installation of the module of the invention is further simple, as thermal interface material layers are not required between the base plate and the cooling element.

The installation with the interface layers is cumbersome as the layers are very thin and brittle or fold easily during installation. With the module of the present invention, the cooling element, such as a heat sink, can be attached directly to the base plate of the module without any intermediate layers. During use, the thermal interface material layers can also break which leads to increased chip temperatures.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 2:
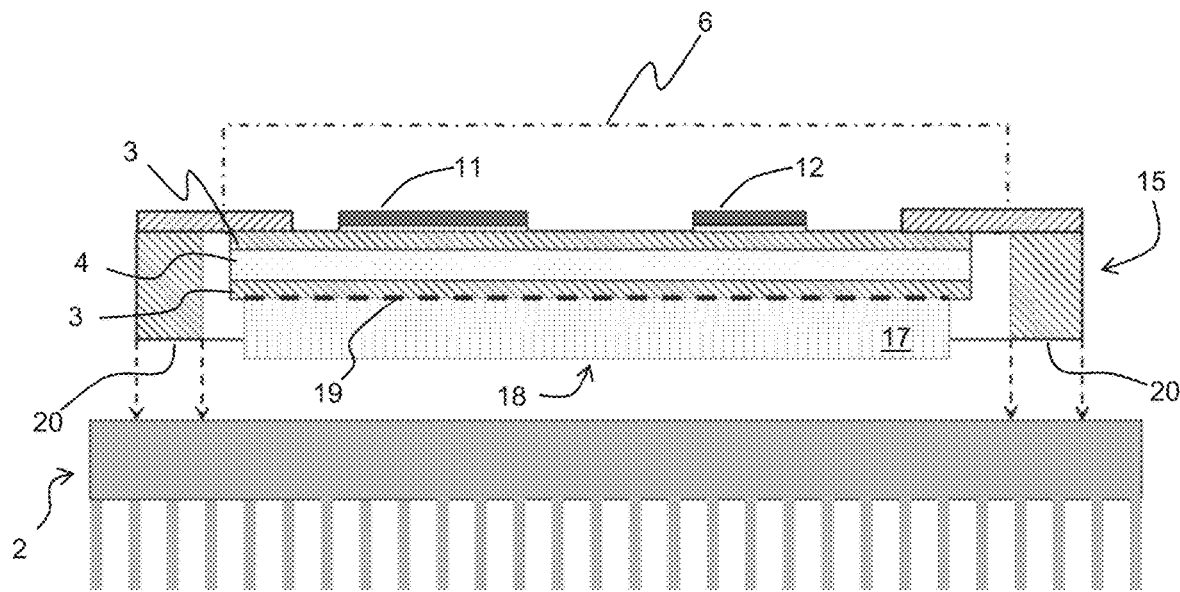
FIG. 2 shows an embodiment of a power electronics module of the present invention prior to attachment to a heatsink.

FIG. 2 shows a cross section of a power electronics module according to an embodiment of the present invention. The cross section of FIG. 2 shows power semiconductor chips 11, 12 soldered to a substrate, such as DBC structure 3, 4. According to the present invention, the power electronics module comprises multiple of power electronic semiconductor chips incorporated in a housing and attached to a substrate. In the description and drawings reference is made specifically to direct bonded copper structure as an example of the substrate. The cross section of FIG. 2 shows only two semiconductor chips 11, 12. However, the number of the chips is not limited to any particular number.

The power electronics module further comprises a heat transfer structure attached to the substrate and having a bottom surface which forms an outer surface of the module and which is adapted to receive a surface of a cooling device. As known, the heat from the semiconductor chips is typically removed through the bottom of the module, which, during use of the module, is attached to a cooling device. In the present invention, a heat transfer structure is attached to the substrate to transfer the heat from the semiconductor chips. The bottom surface of the heat transfer structure forms an outer surface of the power electronics module. This outer surface is also is adapted to receive cooling device, such as a heatsink or any other cooling arrangement which is suitable for cooling a power electronics module.

According to the disclosure, the heat transfer structure comprises a compressible base plate 17. In the embodiment of FIG. 2, the heat transfer structure consists of compressible base plate 17 which is attached to the bottom of the substrate 3, 4. The outer surface 18 of the module 15, which is adapted to receive a cooling device, is also the bottom surface of the compressible base plate 17.

The compressible base plate 17 of the embodiment is attached to the bottom of the substrate with solder or glue 19. Alternatively, the base plate may be attached to the substrate by adhesion forces if the bottom of the substrate is suitably patterned and the surface softness of the base plate allows such adhesion forces. The bond between the base plate and the substrate only needs to keep the two together during the manufacture and handling of the power electronics module. Once a cooling device is attached to the module, the base plate will be firmly held between the substrate and the cooling device.

Figure 3:
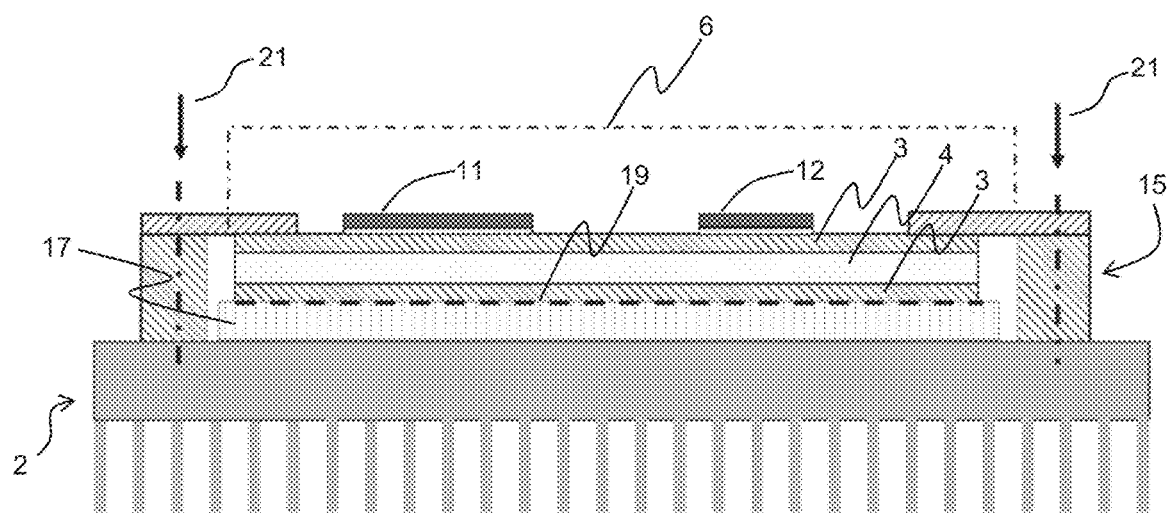
FIG. 3 shows the power electronics module of FIG. 2 attached to a heatsink.
Figure 4:
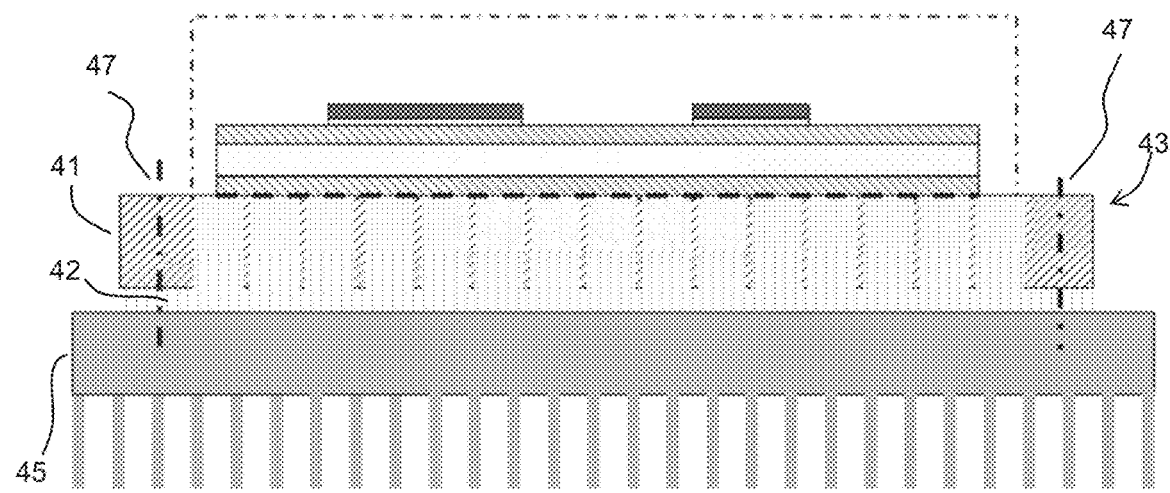
FIGS. 4 and 5 show another embodiments of the present invention.

FIG. 3 shows the power electronics module 15 of FIG. 2 attached to a cooling device 2, such as a heat sink. As seen in FIG. 3, the base plate 18 is compressed when module is attached to the cooling device. In the embodiment the attachment is carried out thought the sides of the module housing. That is, the module is fastened to the cooling device using screws or bolts, for example, which penetrate though the sides of the housing of the power electronics module. In the example of FIGS. 2 and 3, the places of screws are shown with arrows 21. The screws push the housing 6 towards the cooling device and the substrate is shown to pushed down by the housing with inwardly extending members. Thus the screws or bolts do not penetrate the base plate. In the embodiment of FIGS. 2 and 3, the proper attachment and the suitable compression of the base plate is ensured as the compression of the base plate is limited by the amount the housing can move towards the cooling element. That is, when the screws or bolts are tightened, the bottom 20 of the side edges of the module housing 6 is pressed to the surface of the cooling element 2. At the same time, the soft and compressible base plate is compressed in a desired manner such that the possible air gaps in the surface of the cooling device are filled. The side edges of the module housing define a level which is closer to the substrate than the level which is defined by the bottom surface of the heat transfer structure. As the bottom surface of the heat transfer structure extends outside the level defined by the side edges, the heat transfer structure or the base plate is compressed when the module is attached to a cooling device. FIG. 4 shows another embodiment of the power electronics module 43 of the present invention. In the embodiment, the soft and compressible base plate 41 comprises a metal plate having multiple of holes filled with a compressible material. Further, the base plate comprises a layer 42 of compressible material and the layer 42 is adapted to form the outer surface of the module. The metal plate of the embodiment is preferably a copper plate or an aluminium plate. The holes are formed to the metal plate such that the holes extend through the metal plate. Further, the total volume of the holes is higher than the volume of the metal in the plate. In an embodiment, the metal plate has a honeycomb structure, in which the holes are hexagonal or have a hexagonal circumference. The advantage of having a honeycomb structure is that the metal plate is still rigid while the metallic edges between the holes can be small. Further, the honeycomb structure evens out effectively the mechanical stresses caused by temperature changes. The shape of the holes is not, however, limited to a certain shape.

Figure 1:
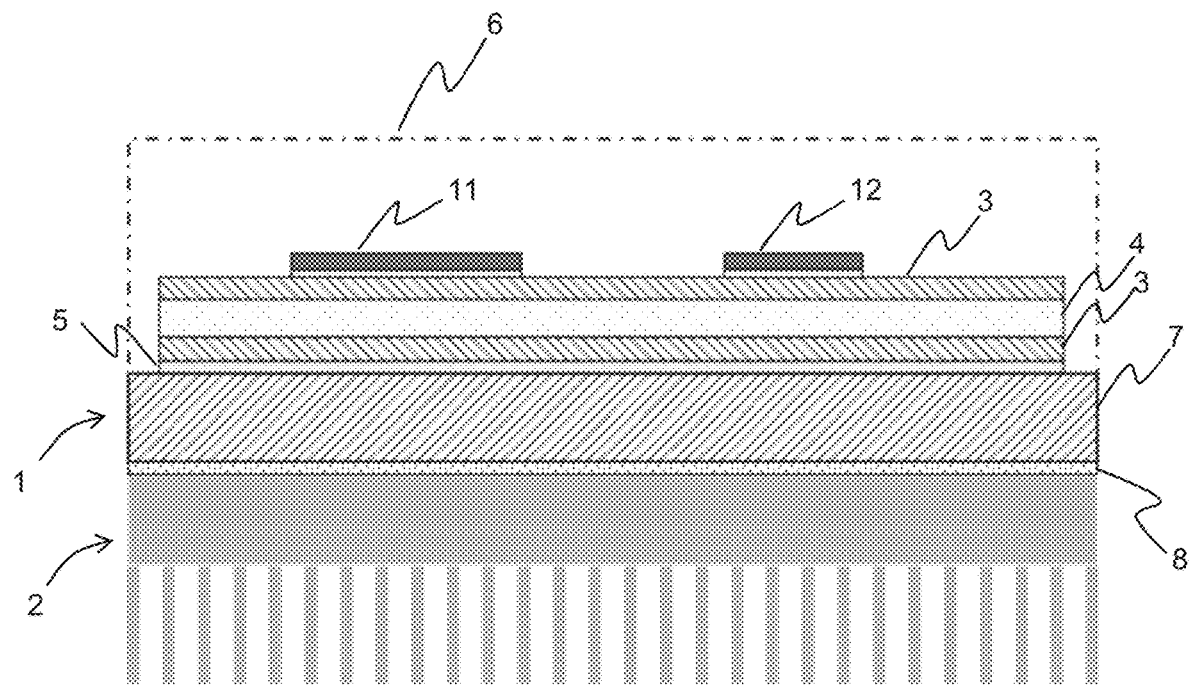
FIG. 1 shows a known power electronics module with a base plate attached to a heat sink.
Figure 6:
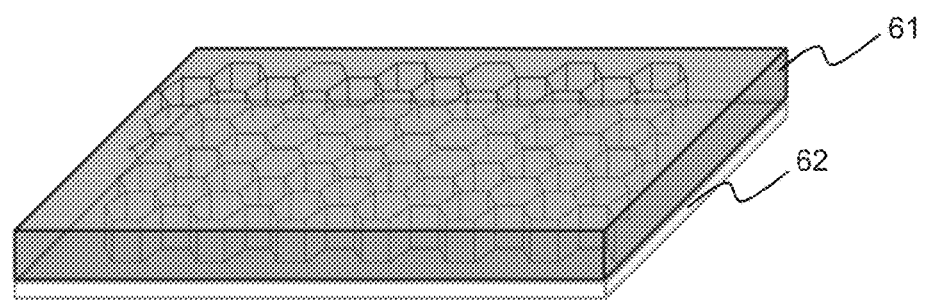
FIG. 6 show an example of a base plate structure employed in the embodiments of the present invention.

According to the embodiment, the holes of the metal plate are filled with a compressible material. When the total volume of the holes is high, it enables to use a high amount of compressible material. A surface of the metal plate has a layer of a compressible material, which is preferably same material as is used for filling the holes. FIG. 6 shows an example of a metal plate 61 with honeycomb structure. The holes of the plate are filled with compressible material and one surface of the plate has a layer 62 of compressible material.

In the embodiment, the compressible material which has high thermal conductivity, is held in form using a metal plate with the high amount of holes. Due to the holes of the plate, the compressible material is prevented from expanding in lateral direction, that is, in the plane defined by the surface of the plate. The layer of material in the surface of the plate ensures that the outer surface of the module provides a thermally effective contact between the module and a cooling device. The compressible and soft material fills any possible gaps of the surface of the cooling device such that the thermal resistance is as low as possible. The base plate 41 of the embodiment is glued or soldered to the bottom of the substrate which is shown in the embodiment to be a direct bonded copper structure.

According to an embodiment the base plate comprises a first copper sheet attached to a surface of the metal plate with holes. In the embodiment the layer of compressible material is applied to a surface of the first copper sheet to form the outer surface of the module. The first copper sheet is not visible in FIG. 4 as the compressible material layer 42 covers the bottom surface of the power electronics module. The first copper sheet provides additional support for the structure and is preferably attached to the metal plate using glue or solder.

Figure 5:
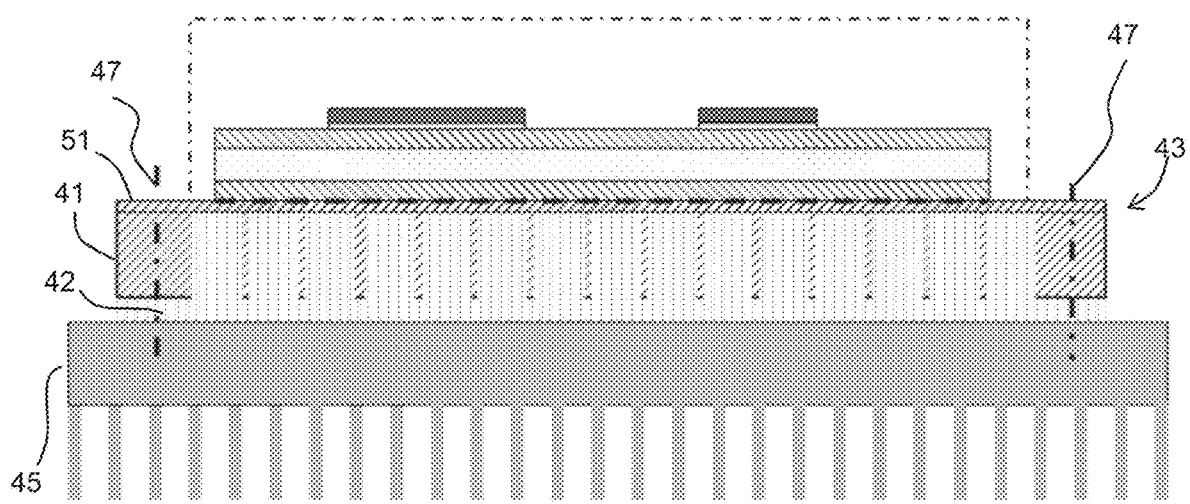

FIG. 5 shows another embodiment of the invention which is modified from the embodiment of FIG. 4. In the embodiment of FIG. 5 the base plate comprises a second copper sheet 51 which is attached to the substrate. Further, the metal plate with holes is attached to the second copper sheet. With the embodiment of FIG. 5, the production of the base plate is made easier and at the same time the structure is made more stable. The second copper sheet 51 is attached to the metal plate with holes, and after the attachment, the holes are filled with compressible and soft material having a high thermal conductivity. With the compressible material in place, the metal plate is then attached to the bottom surface of the substrate. The embodiment of FIG. 5 may also comprise the first copper sheet as in the example relating to FIG. 4.

In the embodiments described with reference to FIGS. 4 and 5 the power electronics module is shown attached to a cooling device 45 which is shown to be a heat sink. The attachment of the power electronics module to a cooling device is carried out in the embodiments using screws or bolts through the base plate in the fixing points 47. The metal plate having the multiple of holes is has thus a fixing hole. The fixing holes are preferably situated in solid areas of the base plate, that is, the multiple of holes of the metal plate are situated such that they cover the footprint area of the substrate. When the holes and the compressible material is situated in the footprint area of the substrate, the sides of the metal plate are intact and can be used for attaching the module through the base plate to a heatsink.

According to another embodiment of the invention, the compressible base plate is formed of one or multiple of layers of graphite or graphene. The thickness of such a compressible base plate is in the range of 50 μm to 700 μm. Such a base plate is attached directly to the surface of the substrate for example by gluing. The power electronics module with a base plate having multiple of layers of graphite or graphene is attached to a cooling device according to the principles set out in FIGS. 2 and 3, for example.

The compressible material used in the invention is preferably a metal alloy having tin, copper and indium. In the soft and compressible metal alloy the relative amounts of the materials are, for example tin less than 50% by weight, indium 20% to 50% by weight and copper 1% to 5% by weight of the total weight of the metal alloy. According to another embodiment, the compressible material may also comprise epoxy resin matrix with heat transferring additives, such as diamond particles. The heat transferring additives may also be added to a metal alloy. The diamond particles may be synthetic or natural, and their radius can be less than 1 μm, but preferably in the range of 1 μm to 125 μm, and their amount in the compressible material may be in the range of 10% to 60% by volume of the total volume of the compressible material. The additive particles may also be made of other solid particles, such as graphene, alumina ($Al_2O_3$), silver or lead.

In the method of producing a power electronics module the method comprises providing multiple of power electronic semiconductor chips incorporated in a housing and attached to a substrate. Further in the method a heat transfer structure is attached to the substrate, the heat transfer structure having a bottom surface which forms an outer surface of the module and which is adapted to receive a surface of a cooling device, wherein the heat transfer structure comprises a compressible base plate. The method of the invention enables to form a power electronics module having the features and advantages described above.

In the above description embodiments of power electronics module are described quite generally as power electronics modules as such are known in the art. It is, however, clear that such modules have a quite large footprint area and the length of the module is typically in the range of 6 to 25 cm:s. The drawings show cross sections of power electronics modules seen from one end of the module. The modules are shown to be cut in the positions of power electronic semiconductor chips.

It will be obvious to a person skilled in the art that, as the technology advances, the inventive concept can be implemented in various ways. The invention and its embodiments are not limited to the examples described above but may vary within the scope of the claims.

The invention claimed is:

1. A power electronics module comprising
multiple of power electronic semiconductor chips incorporated in a housing and attached to a substrate, and
a heat transfer structure attached to the substrate and having a bottom surface which forms an outer surface of the module and which is adapted to receive a surface of a cooling device, wherein the heat transfer structure comprises a compressible base plate,
wherein the compressible base plate comprises heat transferring additives, including synthetic or natural diamond particles, alumina particles, graphene particles, silver particles and/or lead particles.

2. The power electronics module according to claim 1, wherein the heat transfer structure is formed of the compressible base plate which is attached to the substrate.

3. The power electronics module according to claim 1, wherein the compressible base plate comprises a metal plate having multiple of holes filled with a compressible material and a layer of compressible material, wherein the layer of compressible material is adapted to form the outer surface of the module.

4. The power electronics module according to claim 3, wherein the layer of compressible material is applied to the surface of the metal plate.

5. The power electronics module according to claim 3, wherein the compressible base plate comprises a first copper sheet attached to a surface of the metal plate, wherein the layer of compressible material is applied to a surface of the copper sheet to form the outer surface of the module.

6. The power electronics module according to claim 1, wherein the base plate comprises a second copper sheet which is attached to the substrate.

7. The power electronic module according to claim 1, wherein the compressible base plate is adapted to be deformed when the module is attached to a cooling device.

8. The power electronics module according to claim 1, wherein the housing of the module comprises side edges surrounding the base plate, the side edges having a bottom surface which is adapted to be attached against a cooling device,
wherein the bottom surface of the side edges defines a level which is closer to the substrate than the level defined by the bottom surface of the heat transfer structure.

9. The power electronics module according to claim 1, wherein the substrate is a direct bonded copper structure.

10. The power electronics module according to claim 1, wherein the compressible base plate comprises an epoxy resin matrix.

11. The power electronics module according to claim 2, wherein the compressible base plate comprises a metal plate having multiple of holes filled with a compressible material and a layer of compressible material, wherein the layer of compressible material is adapted to form the outer surface of the module.

12. The power electronics module according to claim 11, wherein the layer of compressible material is applied to the surface of the metal plate.

13. The power electronics module according to claim 11, wherein the compressible base plate comprises a first copper sheet attached to a surface of the metal plate, wherein the layer of compressible material is applied to a surface of the copper sheet to form the outer surface of the module.

14. The power electronics module according to claim 2, wherein the base plate comprises a second copper sheet which is attached to the substrate.

15. The power electronic module according to claim 2, wherein the compressible base plate is adapted to be deformed when the module is attached to a cooling device.

16. A method of producing a power electronics module comprising
providing multiple of power electronic semiconductor chips incorporated in a housing and attached to a substrate, and
attaching a heat transfer structure to the substrate, the heat transfer structure having a bottom surface which forms an outer surface of the module and which is adapted to receive a surface of a cooling device, wherein the heat transfer structure comprises a compressible base plate,
wherein the compressible base plate comprises heat transferring additives, including synthetic or natural diamond particles, alumina particles, graphene particles, silver particles and/or lead particles.

* * * * *